(12) United States Patent  
Scherer et al.

(10) Patent No.: US 6,711,200 B1
(45) Date of Patent: Mar. 23, 2004

(54) TUNEABLE PHOTONIC CRYSTAL LASERS AND A METHOD OF FABRICATING THE SAME

(75) Inventors: Axel Scherer, Laguna Beach, CA (US); Oskar Painter, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 342 days.

(21) Appl. No.: 09/656,324

(22) Filed: Sep. 6, 2000

Related U.S. Application Data

(60) Provisional application No. 60/152,834, filed on Sep. 7, 1999, and provisional application No. 60/156,010, filed on Sep. 23, 1999.

(51) Int. Cl.[7] ................................................. H01S 3/03
(52) U.S. Cl. ............................ 372/64; 372/92; 372/19; 372/39; 372/20
(58) Field of Search .......................... 372/102, 39, 96, 372/20, 32, 19, 69, 64, 92

(56) References Cited

U.S. PATENT DOCUMENTS

| | | | | |
|---|---|---|---|---|
| 5,229,320 A | * | 7/1993 | Ugajin | 437/107 |
| 5,482,890 A | * | 1/1996 | Liu | 437/107 |
| 5,663,592 A | * | 9/1997 | Miyazawa | 257/627 |
| 6,028,693 A | * | 2/2000 | Fork | 359/248 |
| 6,151,347 A | * | 11/2000 | Noel | 372/45 |
| 6,366,598 B1 | * | 4/2002 | Nichols | 372/102 |

FOREIGN PATENT DOCUMENTS

| | | | |
|---|---|---|---|
| JP | 02282232 A | * | 11/1990 |
| JP | 02282233 | * | 11/1990 |

* cited by examiner

*Primary Examiner*—Leon Scott, Jr.
(74) *Attorney, Agent, or Firm*—Daniel L. Dawes; Myers Dawes Andras & Sherman LLP

(57) ABSTRACT

Room temperature lasing from optically pumped single defect in a two-dimensional photonic bandgap crystal is illustrated. The high Q optical microcavities are formed by etching an array of air holes into a half wavelength thick multiquantum well waveguide. Defects in the two-dimensional photonic crystal or used to support highly localized optical modes with volumes ranging from 2 to 3 $(\lambda/2n)^3$. Lithographic tuning of the air hole radius and the lattice spacing is used to match the cavity wavelength to the quantum well gain peak, as well as to increase cavity Q. The defect lasers were pumped with 10–30 nsec pulse of 0.4–1 percent duty cycle. The threshold pump power was 1500 milliwatts. The confinement of the defect mode energy to a tiny volume and the enhancement of the spontaneous emission rate make the defect cavity an interesting device for low threshold, high spontaneous emission coupling factor lasers, and high modulation rate light emitting diodes. Optic structures formed from photonic crystals also hold promise due to the flexibility of their geometries. Lithographic methods may be employed to alter the photonic crystal geometry so as to tune device characteristics. The integration of densely packed photonic crystal waveguides, prisons, and light sources integrated on a single monolithic chip is made possible. Lithographically defined photonic crystal cavities may also find use in some material systems as an alternative to epitaxially grown mirrors, such as for long wavelengths vertical cavity surface emitting lasers (VCSEL) and GaN based devices.

52 Claims, 14 Drawing Sheets

INCREASING r/a
[0.31 - 0.33]

1300 1400 1500 1600
WAVELENGTH (nm)

TUNEABLE PHOTONIC CRYSTAL LASERS AND A METHOD OF FABRICATING THE SAME

RELATED APPLICATIONS

The present application relates back to U.S. Provisional Patent Application No. 60/152,834 filed on Sep. 7, 1999 and to U.S. Provisional Patent Application No. 60/156,010 filed on Sep. 23, 1999.

The present application was funded at least in part by the National Science Foundation funding pursuant to NSF Grant No. ECS-9632937 and may be subject to government rights.

BACKGROUND OF THE INVENTION

1. Field of the Invention

The invention relates to the field of semiconductor lasers and in particular to semiconductor lasers with nanocavities, or the use of a two-dimensional photonic crystal to localize light to a single or a selected number of defects, thus forming a high Q microcavity laser with a small modal volume.

2. Description of the Prior Art

High reflectivity mirrors have been a key ingredient to reducing the modal volume of optical laser cavities. In 1991, the operation of ultra-small cavities with lateral dimensions of 400 nm diameters was realized. The mode volume in these lasers was still rather large, approximately two cubic wavelengths due to the deep penetration of light into the mirrors.

Microdisk lasers with similar mode volumes emerged in 1993 and relied on high cavity Qs resulting from total internal reflection of light from the perimeter of the disk. In these devices, the light is guided in a thin slab, and reflects as whispering gallery modes along the circumference of the circular laser cavity. Consequently, bend losses become prohibitively large in devices with diameters below 1.5 microns.

It has been known for many years that an emitter's spontaneous emission rate is controlled by its local electromagnetic environment, but the experimental demonstrations of controlled spontaneous lifetime at optical wavelengths are comparatively recent. This is especially true for semiconductor microcavity light emitters. Recently the benefits of using the discrete energy levels of quantum dots (QDs) to obtain microcavity controlled emission was demonstrated in a planar microcavity and then with a dielectric aperture in a semiconductor microcavity.

What is needed is a design and fabrication technique to realize these optically pumped nanocavities in room temperature, electrically pumped devices.

BRIEF SUMMARY OF THE INVENTION

According to the invention it is now possible to microfabricate Bragg reflectors in one, two and even three dimensions. Two and three-dimensional microfabricated mirrors, generally referred to as photonic bandgap (PBG) crystals, can now be used to confine light to even smaller cavity volumes. In turn, this allows the definition of ultra-small subwavelength optical cavities. In such "nanocavities", the mode volume can be as small as 2.5 cubic half wavelengths or 0.3 $\mu m^3$ and spontaneous emission can be efficiently coupled into the lasing mode. This efficient coupling in turn results in advantages in low noise, high modulation speed and very low threshold powers. These low threshold sources are very versatile and fast sources which can in turn be coupled together or to other nano-optic devices.

The defect cavity is illustrated here utilizing a half wavelength thick high-index membrane to confine light vertically by way of total internal reflection similar to the design of a whispering gallery microdisk laser. The high index slab is then perforated with an hexagonal array of air holes, which Bragg reflects the light in plane. A defect is formed in the two-dimensional photonic lattice by removing an air hole and/or adjusting the diameters of the few neighboring air holes. A mode or set of modes depending on the defect geometry, which is highly localized to the defect region, is formed. Photons can escape from the defect cavity by tunneling through the two dimensional photonic crystal, or by leaking out vertically from the waveguide.

It is now possible, by controlling both mirror geometry and growth, to control the spontaneous emitter's radiative lifetime through mode confinement. We believe that this effect will ultimately provide significant improvements in lasing thresholds, speed, and efficiency over more conventional vertical cavity surface emitting laser (VCSEL) devices. By using high resolution microfabrication and carefully designed nanocavities, we have shown that we can define laser cavities in which over 85% of the spontaneously emitted light is coupled into a single lasing mode. This high spontaneous emission coupling factor ($\beta$) is obtained at the expense of microfabricating mirrors by ion etching, resulting in structures with high surface to volume ratios.

Fabrication techniques for constructing two-dimensional photonic band gap crystals make it possible to control the propagation of light within a semiconductor material and to create optical microcavities with very small volumes.

Confinement of light in the vertical direction can be obtained by using a suspended membrane of high refractive index material surrounded by air on both sides. A two dimensional photonic crystal in the horizontal plane can then be defined into this wave-guiding slab to form an optical microcavity 36, and waveguides in the photonic crystals can be used to connect adjacent optical devices. Microcavities based on photonic crystals can therefore be used as light emitting devices with very small mode volumes, efficient microlaser sources, and in-plane microresonator networks.

Here we design and fabricate such in-plane membrane microresonators with the desired freedom in the geometrical design of the cavities as well as the possibility of efficient coupling. We consider the use of a triangular array of air holes in a slab of material with a high dielectric constant, which has been shown to exhibit a band gap for both transverse electric (TE) and transverse magnetic (TM) polarizations. The InGaAs/InGaAsP material system was chosen since it does not suffer from large surface recombination losses and is relatively easy to microfabricate structures into. It has previously been used to demonstrate optically and electrically pumped whispering gallery mode microdisk lasers with diameters down to 2 $\mu$m and cavity thickness comparable to our designs.

The cavity structures are formed by combining localization in a thin high refractive index slab due to total internal reflection, and lateral confinement with the use of a two dimensional photonic crystal. The high index slab in our case is, designed to be half a wavelength thick in order to shrink the optical mode volume as much as possible. Two dimensional band structure calculations are first performed to establish approximate characteristics of a perfectly periodic two dimensional photonic crystal in an optically thin slab.

The invention and its various embodiments may now be better visualized by turning to the following drawings, wherein like elements are referenced by like numerals.

BRIEF DESCRIPTION OF THE DRAWINGS

FIG. 16 is a plot of the ratio of $a/\lambda_0$ of the emission peaks versus d/a.

FIG. 21a is a top plan view and FIG. 21b is a side cross-sectional perspective view of a single defect laser formed in an n-doped substrate with a p-doped surface.

DETAILED DESCRIPTION OF THE PREFERRED EMBODIMENTS

Figure 1A:
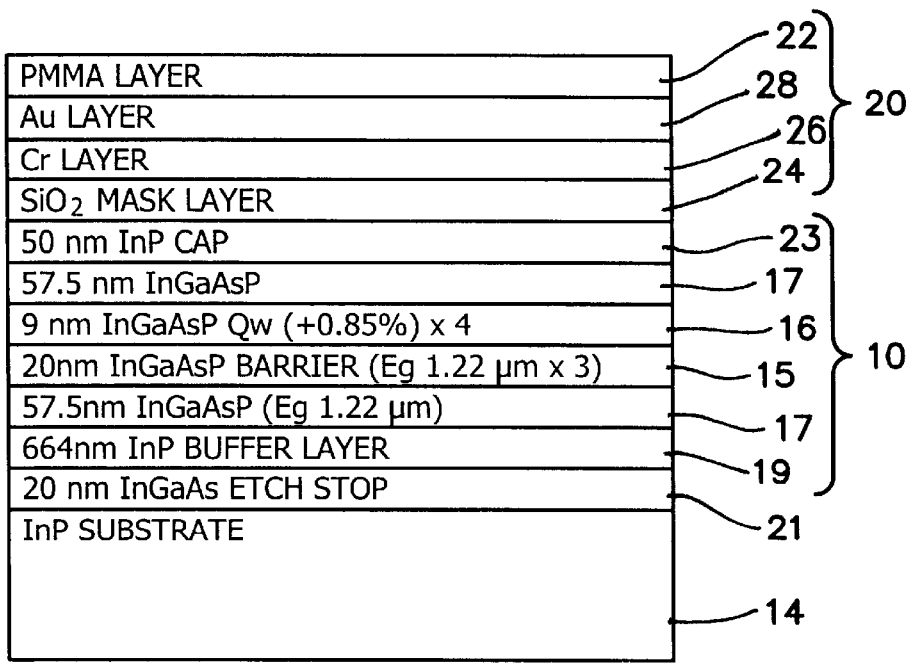
FIGS. 1a–1d are diagrammatic side cross-sectional views of a sample illustrating the method of fabrication of the device according to the invention.

Defect lasing microcavities are fabricated in a InGaAsP/InP material system. The InGaAs/InGaAsP materials system was chosen since it does not suffer from large surface recombination losses and is a relatively easy material into which structures can be microfabricated. This material has previously been used to demonstrate the first optically and electrically pumped whispering gallery mode microdisk lasers with radii down to 1 micron and cavity thicknesses comparable to our designs. The choice of this material system is based upon its relatively slow surface recombination velocity, which is important due to the large surface to volume ratios present in the defect cavities. Metalorganic chemical vapor deposition was used to grow the laser structure on an InP substrate 14 as shown in FIGS. 1a–1d.

The device is fabricated with quantum dots embedded in a perforated membrane disposed on a substrate. InGaAs quantum dots can be designed to emit light in the 1.1–1.3 micron wavelength range which is a useful range for telecommunication. Quantum dot active material is also relatively insensitive to surface recombination, and is therefore an ideal material for fabricating active structures with high surface-to-volume ratios, such as photonic bandgap laser microcavities.

High resolution electron beam lithography and directional ion etching are used to fabricate the two dimensional photonic crystals, which exhibit band gaps in visible and near-IR wavelength range. A high resolution and high brightness field emission electron beam lithography system (a modified Hitachi S-4500 field-emission electron microscope) with a 0.9 nm spot size, alignment accuracy of 15 nm, and a beam-writable sample area of up to 6 inches is used for fabrication. A computer interface and program is used to control this instrument to define photonic crystals by electron beam lithography. Ion etching and mask transfer techniques were also developed to define the two dimensional photonic crystals into GaAs, InGaAs, GaN and InGaP active materials as discussed in connection with FIGS. 1a–1d.

To construct an InGaAs quantum dot PBG device 11, an approximately 200 nm thick slab waveguide 10 shown in FIGS. 1a–1d containing a 9 nm InGaAsP quantum well layer 16. In the illustrated embodiment optical gain is provided by four 0.85% compressively strained quaternary quantum wells designed for peak emission at 1.55 μm at room temperature. 20 nm barriers 15 in layer 16 are also quaternary with a room temperature bandgap of 1.22 μm. 57.5 nm cladding material 17 is identical to the barriers and is disposed on top and on the bottom of the active region to isolate the quantum wells from the surface and to increase final waveguide thickness. A 664 nm sacrificial InP layer 19 is grown beneath the quantum wells in layer 16 and cladding layer 17 in order to later free the membrane. A thin 20 nm InGaAs stop layer 21 is grown below sacrificial layer 19 deposited on a GaAs substrate 14 by molecular beam epitaxy. A 50 nm InP cap 23 is disposed on upper cladding layer 17 of waveguide 10.

Figure 1B:
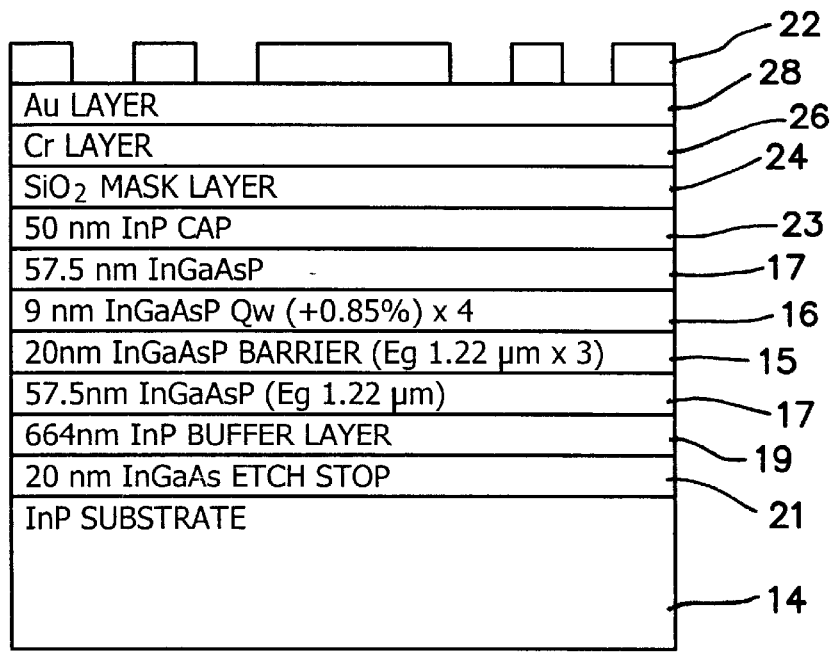
Figure 1C:
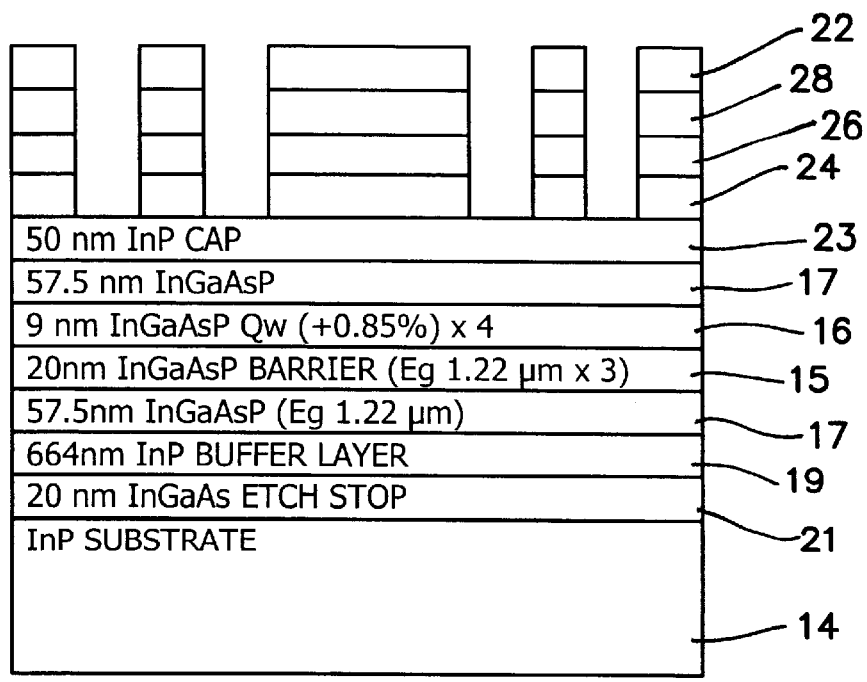
Figure 1D:
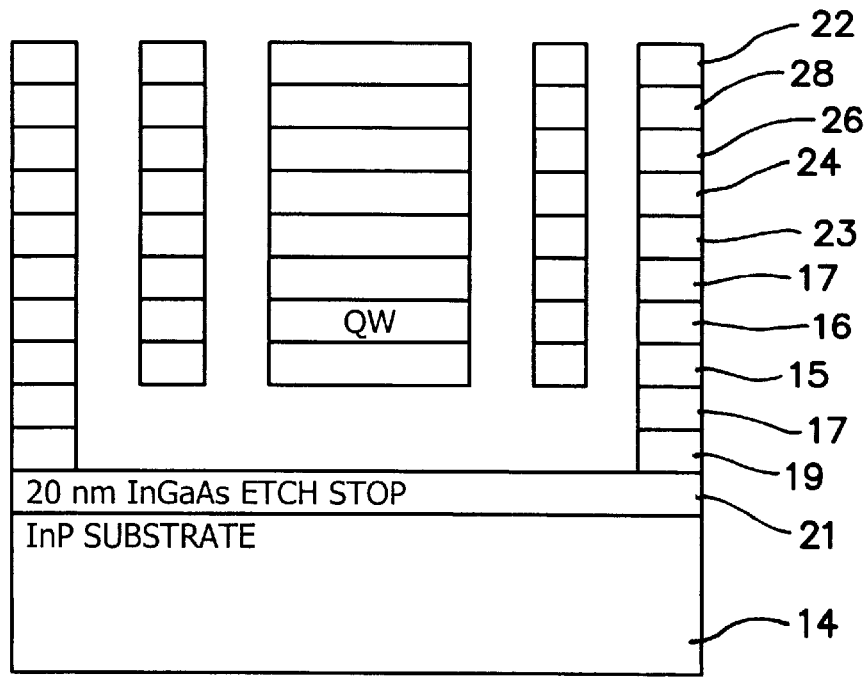

A surface mask 20 composed of 60 nm of $SiO_2$ layer 24, followed by a 5 nm Cr layer 26, a 50 nm Au layer 28, and 70 nm of 2% polymethylmethacyclate (PMMA) 22 is then deposited on top of the sample comprised of waveguide 10, layers 19, 21, 23 and substrate 14. The PMMA resist layer 22 is photolithographically exposed with an electron beam to define the two dimensional photonic crystals and optical cavities. After developing exposed PMMA resist layer 22 in cellusolve/methanol as shown in FIG. 1b, the patterns in the PMMA resist layer 22 are transferred through the Cr and Au layers 26 and 28 with an Ar$^+$ ion beam. This metal mask 26, 28 is used to transfer the lithographic patterns into the SiO$_2$ mask layer 24 by using a C$_2$F$_6$ reactive ion etching (RIE) process as shown in FIG. 1c to etch holes 30 through layer 24. The final dry etching step is a Cl$_2$ assisted ion beam etch to transfer air holes 30 through layers 15, 16, 17, and 23 and into sacrificial layer 19. Once the dry etching is complete the remains of surface mask 20 are removed using a buffered oxide etch.

The perforated waveguide 10 is then undercut by placing the sample in a slightly agitated HCl (4:1) solution at room temperature. The HCl solution enters through holes 30 and selectively removes the underlying InP material, stopping on the InGaAs etch stop layer 21, thus providing a smooth bottom surface interface. After the holes 30 are etched through the InGaAs and InGaAsP layers, the cladding layer 17 can be selectively oxidized by isotropic steam oxidation through the microfabricated holes 30. This procedure leaves a membrane of perforated InGaAs quantum dots within membrane micro-resonators on InP. Although the materials are illustrated above in a specific choice, it is to be expressly understood that other materials and corresponding fabrication methods could be equally substituted.

Figure 2:
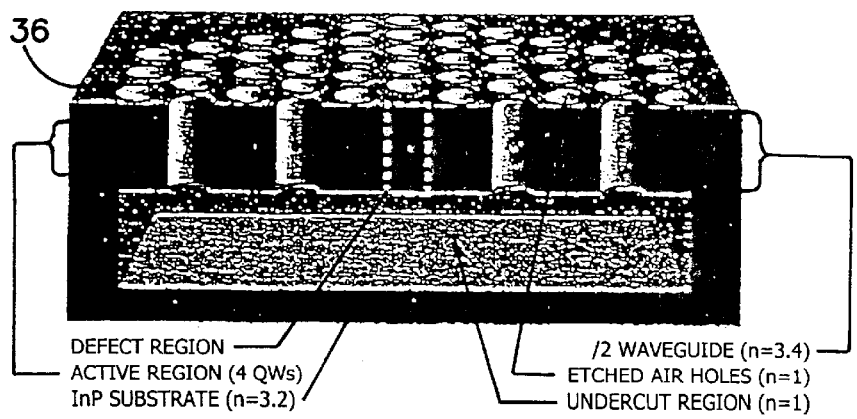
FIG. 2 is a perspective view of a completed device made according to the method illustrated in FIGS. 1a–1d.

The resulting structure is illustrated in perspective view in FIG. 2 where holes 30 have been patterned into device 11 to define a single defect region 36. As will be discussed below defect regions 11 may be created by omitting holes 30 in a pattern as in FIG. 4 or by adding holes of different sizes as in FIG. 3. In addition, multiple defects in the array of holes may be created to define a defect region 36.

Fabrication techniques for constructing two dimensional photonic bandgap crystals make it possible to control the propagation of light within a semiconductor material and to create optical microcavities with very small volumes. Confinement of light in the vertical direction can be obtained by using a suspended membrane of high refractive index material surrounded by air on both sides. A two dimensional photonic crystal in the horizontal plane of layer 16 can then be defined into waveguide 10 to form an optical microcavity 36, and other waveguides (not shown) communicating with the photonic crystals in layer 16 can be used to connect adjacent optical devices (not shown). Microcavities based on photonic crystals can therefore be used as light emitting diodes and lasers with very small mode volumes, and exhibit large spontaneous emission factors and high quality factors (Q). Such high-Q in-plane membrane microresonators are characterized by a freedom in the geometrical design of the cavities as well as the possibility of efficient coupling. For the photonic crystal, a triangular array of air holes is used in a slab of material with a high dielectric constant, which has been shown to exhibit a bandgap for both TE and TM polarizations.

Consider first the tuning of the direction of light emission from a photonic crystal cavity 36 by microfabrication. We demonstrate the lithographic control over the resonance frequency of a two dimensional photonic crystal cavity 36 by altering (a) the lattice parameter of the photonic crystal and (b) the hole sizes of the periodic air columns defining the photonic crystal within a waveguide slab. We demonstrate that, by changing the local geometry next to the optical cavity 36 defined within a photonic crystal, it is possible to manipulate the direction of lasing within that cavity 36. This can be used to deliberately couple cavities together and to directionally pump them in-plane. For example, by enlarging the sizes of two holes 32 relative to the regular array of holes 34 adjacent to the cavity 36 as shown in top plan view of FIG. 3, the symmetry of the defect cavity 36 is broken and emission occurs in the direction perpendicular to these holes 32.

By changing the local geometry next to resonant cavities defined within photonic crystals the direction of lasing within these cavities can be manipulated. This concept is very useful when deliberately coupling cavities together or when directionally pumping these microcavities in-plane. In a perfectly symmetrical optical cavity, lasing can occur in any one of six symmetry directions, and would randomly choose the preferred direction. By enlarging the sizes of two holes adjacent to the cavity the symmetry of the defect cavity is broken and emission occurs in the direction perpendicular to these holes. Similarly, by moving some of the holes 34 adjacent to the cavity 36 by as little as 20 nm, this deviation from the perfect hexagonal geometry again breaks the symmetry of the cavity 36 and results in a preferred direction of lasing. This will make it possible to construct many optical cavities and waveguides within one monolithic perforated slab, and to connect these so that the light has to interact with these photonic crystal components to form a compact photonic circuit.

Figure 4:
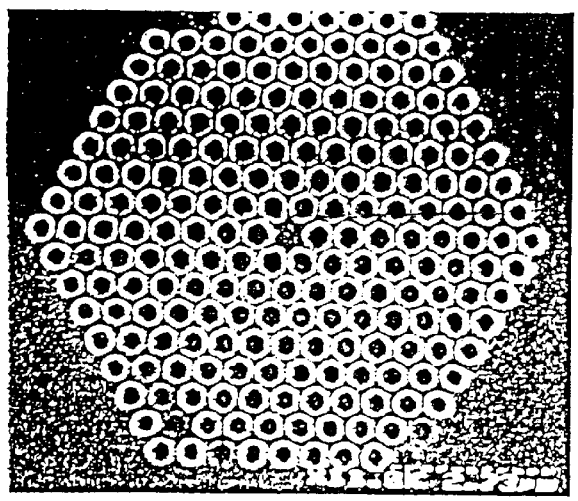
FIG. 4 is a top plan view diagram showing a defect region created by breaking symmetry of the array of holes by omitting at least one hole of the array, which in this view is the smallest defect region which can be created in the array.

The smallest optical cavity 36 in FIG. 4 which can easily be defined within the two-dimensional photonic crystals is comprised of a single defect. The photonic bandgap structure is comprised of a perforated slab waveguide and is in this case used as a microfabricated mirror, defining a two-dimensional Fabry-Perot micro-resonator laser cavity 36. Only a few modes are supported in such a cavity 36, and thus single defect optical microcavities can be designed as efficient microlasers with both a high spontaneous emission factor β and high Q. Light in this cavity 36 is confined within the microfabricated slab or membrane waveguide by the high index contrast in the vertical direction and by the photonic crystal in the horizontal direction. If an infinite photonic crystal surrounds a defect cavity 36, the cavity Q is determined by the light leakage perpendicular to the perforated slab waveguide surface. However, if a finite photonic crystal mirror is defined, the cavity Q will be determined by the perpendicular losses as well as the in-plane losses of light through the mirror layers. The devices most similar to photonic crystal lasers are the whispering gallery mode lasers developed by A. Levi and R. Slusher in 1991. In both structures, the light is waveguided in a thin membrane, and is reflected in the lateral direction to define a high Q cavity. In the microdisk lasers, the light reflects along the periphery around the circumference of the laser disk, whereas in the photonic crystal devices, it is rejected from microfabricated photonic crystal. Laser cavities can also be easily coupled and connected together through the photonic crystal.

Figure 5A:
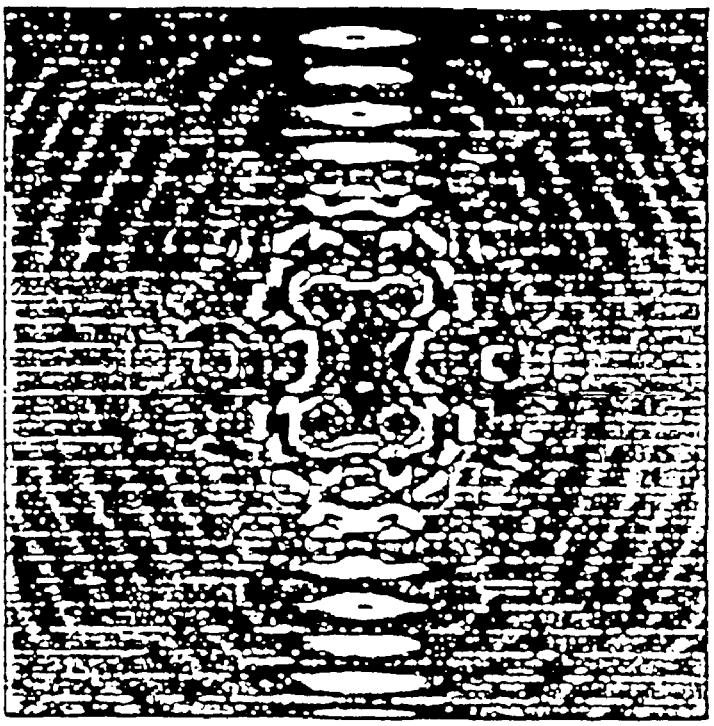
FIG. 5A is the field intensity of a horizontal cross section of a single defect as seen in a top plan view and in a side cross-sectional view in FIG. 5B.
Figure 5B:
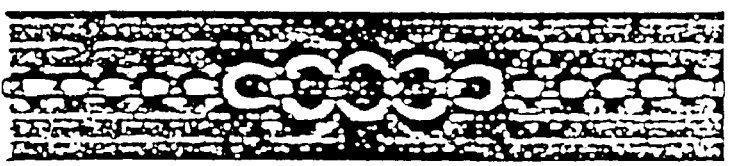
FIG. 5B is a side cross-sectional view of FIG. 5A.
Figure 6:
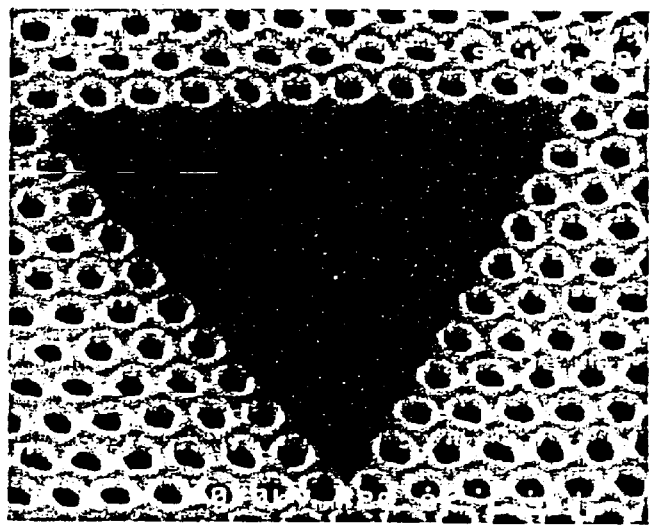
FIG. 6 is a diagram of a hexagonal multiple hole cavity.
Figure 7:
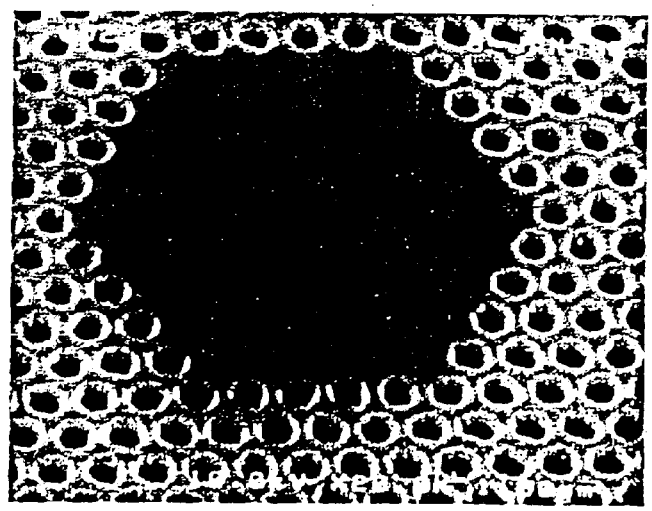
FIG. 7 is a diagram of a triangular multiple hole cavity.

The field intensity is plotted in a horizontal cross section of a single defect device is shown in top plan view in FIG. 5a and in side cross-sectional view in FIG. 5b. The total cavity Q can be controlled by changing the photonic crystal spacing the thickness of the waveguide, and the porosity (r/a) of the photonic crystal. By optimizing this geometry, the vertical losses can be minimized and the overall Q of the cavity 36 increased. Our numerical calculation can be used to determine the Q of cavities 36 as a function of the number of periods of crystal layers surrounding the defect by observing the energy loss in a finite difference time domain calculation of the field intensities. For small numbers of photonic crystal layers. the Q is controlled by the in-plane losses, whereas if more than 5 periods of photons crystal surround the optical microcavity 36 the effect of perpendicular losses become more important. For 7 layers of photonic crystals surrounding a single defect, the calculated cavity Qs can be well over 20,000, and the losses are dominated by out-of-plane losses. A hexagonal multiple hole cavity 36 is shown in FIG. 6 and a triangular multiple hole cavity 36 is shown in FIG. 7 with about 5 μm lateral dimensions with six InGaAs quantum wells in a membrane about 180 nm thick.

The dependence of Q on the roughness of the holes was also investigated, and it was found that the Q values are not very sensitive to the precise shape or surface roughness of the photonic crystal, but strongly influenced by the periodicity of the holes and the cavity size. Thus, it is quite realistic to expect microfabricated devices to yield high Q values similar to the modeled results.

Figure 3:
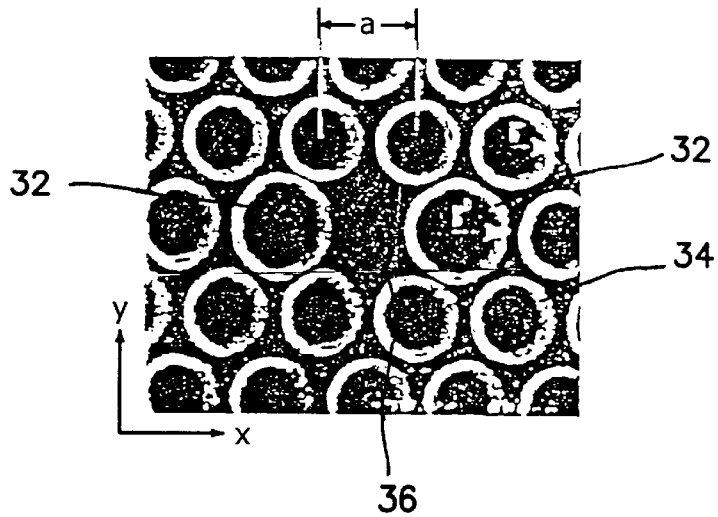
FIG. 3 is a top plan view diagram showing a defect region created by breaking symmetry of the array of holes by enlarging the size of two or more holes of the array.

As stated above, it is possible and desirable to construct many optical cavities and waveguides within a perforated slab, and to connect these so that the light has to interact with these photonic crystal components to form a photonic circuit. This requires control over the emission direction into and out of the optical cavities, which will serve as laser sources, filters, or modulators. In a perfectly symmetrical optical cavity 36, lasing can occur in one of the three symmetric directions, and would randomly choose the preferred direction. When we deliberately change, through lithography, the symmetry, we can predict the direction of emission and it is possible then to design the optical circuit around that known emission direction. An example is shown in FIG. 3, where light emission is preferred in the vertical direction out of the plane of the Figure, since the holes next to the photonic crystals are slightly enlarged in the horizontal direction.

Three-dimensional finite difference time domain simulations can be used accurately modal electromagnetic modes of the complex structure such as a photonic crystal microbe cavity 36. The structure is discretized on a three-dimensional mesh and appropriate boundary conditions are applied at the outer surface of the computational domain. In the calculations presented here, an initial electric and magnetic field is defined in the mesh and the finite difference time domain simulations is used to step the field in time. The discrete electromagnetic modes of the structure show up his residence peaks in a Fourier transform of the time step field. A given discrete mode may then be isolated in the structure by convolving the field in time with a band pass filter. This allows one to associate given mode patterns and symmetries with different resonance peaks. For localized modes of the cavity 36, the power that is radiating from the competition domain may also be calculated using Poynting vector from which one can estimate the quality factor of the mode. In order to elucidate many results discussed here, it will be important analyze the effects of varying cavity geometries on the defect modes of the structure using these finite difference time domain simulations methods.

The defect cavity illustrated here is formed from two basic building blocks: a high index slab or waveguide 10, and a two-dimensional photonic crystal 16. Since the high index slab 10 is approximately a half wavelength thick, it is not accurate to neglect the finite nature of the two-dimensional photonic crystal 16. The guided modes of a symmetric perforated waveguide 10 can be classified simply as even or odd modes, pertaining to the mode symmetry about the horizontal mirror plane in the middle of the slab 10. The even and odd vertically guided modes may be termed TE-like and TM-like, respectively, in connection to the modes of a two dimensional photonic crystal which is infinite in the third direction. The TE-like and TM-like labels only provide an accurate description for the lower lying frequency bands of the fundamental vertically guided modes. A more detailed analysis of the modes of finite two dimensional photonic crystal slabs is presented and well known in the literature.

Figure 8A:
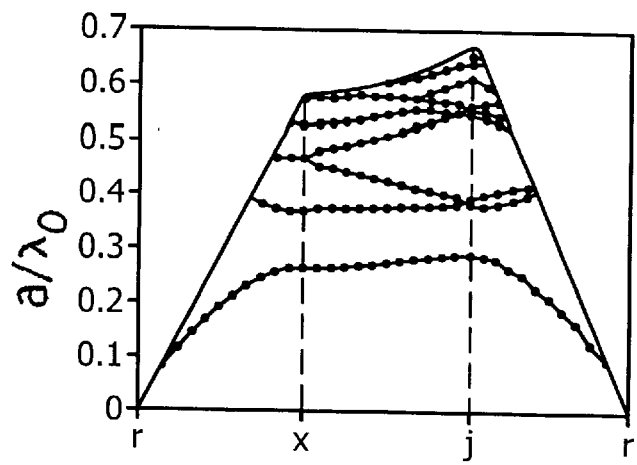
FIGS. 8A and 8B are TE-like and TM-like modes graphs.
Figure 8B:
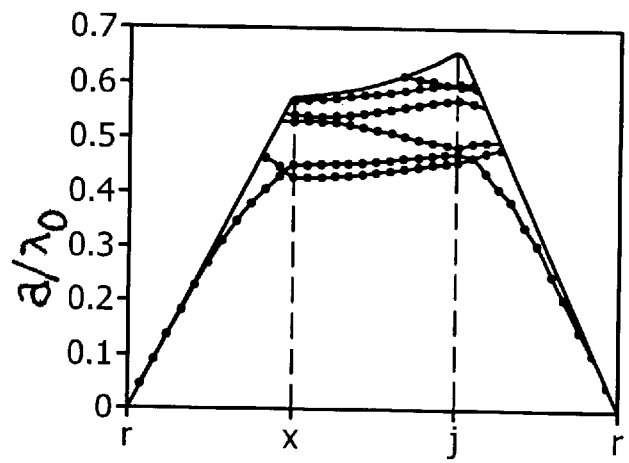

The photonic crystal lattice used in this work is a triangular array of air holes as shown in FIG. 4. The important parameters in defining the photonic crystal structure are the lattice spacing (a), the hole radius (r), the slab thickness (d), the slab index ($n_{slab}$) and the outer cladding index ($n_{clad}$). A dispersion diagram of frequency versus in-plane momentum for the TE-like (even) modes is given in the graph of FIG. 8a. In this calculation r/a was set to 0.32, d/a to 0.409, $n_{slab}$ to 3.4, and $n_{clad}$ to 1. The solid line in FIG. 8a, above which no bands have been plotted, represents the light line of photons in the air cladding. Photons with frequencies above the light line can propagate in the air. and thus are leaky resonant modes of the slab or non-resonant radiation modes. The bands plotted below the light line represent the guided modes of the photonic crystal slab. As shown in FIG. 8a there exists a frequency band gap for the TE-like guided modes between the first two bands. We will use the terms "air" and "dielectric" band to describe the upper and lower band defining the bandgap, respectively. The air band mode has its electric field intensity localized in the air holes, while the dielectric band E field is localized to the high index rib sections. The dielectric band is completely guided over the entire first Brillouin zone, while the air band is leaky around the top appoint. The leaking nature of the air band is the supplemental source of vertical radiation loss from the defect cavity 36. The band diagram of the TM-like (odd) guided modes is plotted in FIG. 8b within r/a ratio of 0.32 and a slab effective index of three point for a bandgap does not form for the TM-like guided modes. For our purposes, however, this is beneficial as it will limit the number of high Q localized modes of the defect (TE-like only).

Figure 9:
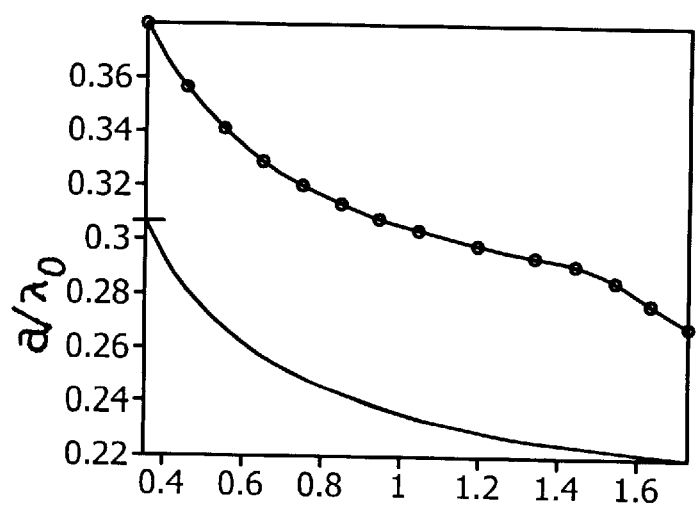
FIG. 9 is a graph of the band edge frequencies defining the TE-like bandgap versus the slab thickness.

A plot of the band edge frequencies defining the TE-like bandgap versus the slab thickness is shown in FIG. 9. As the slab is made thinner and vertical localization is increased, the band edge frequencies increase. If the guided modes are confined to the slab, the bandgap actually increases as slab is made thinner. At slab thicknesses less than half wavelength the air band mode (at the band edge) substantially loses confinement and the bandgap starts to decrease. As the slab thickness is increased above a full wavelength, then higher order guided modes may enter the bandgap. The sharp drop off of the air band frequency for d/a greater than 1.4 corresponds to the movement of a higher order guided mode into the bandgap. The devices illustrated here have a mean d/a value of 0.41, which corresponds to just under half a wavelength (in a slab of index 3.4) for frequencies at midgap.

Figure 10A:
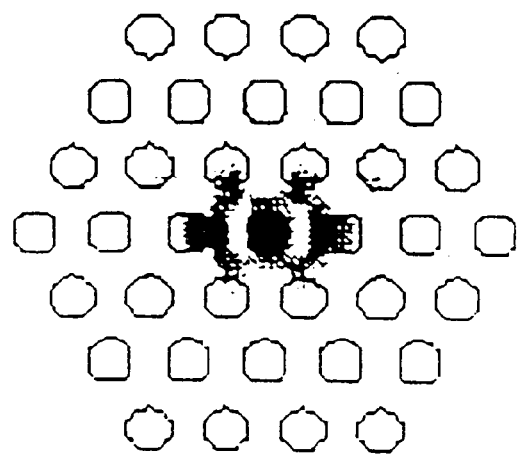
FIG. 10a is a diagram showing the localized mode for an X dipole and FIG. 10b is a diagram showing the localized mode for an Y dipole.
Figure 10B:
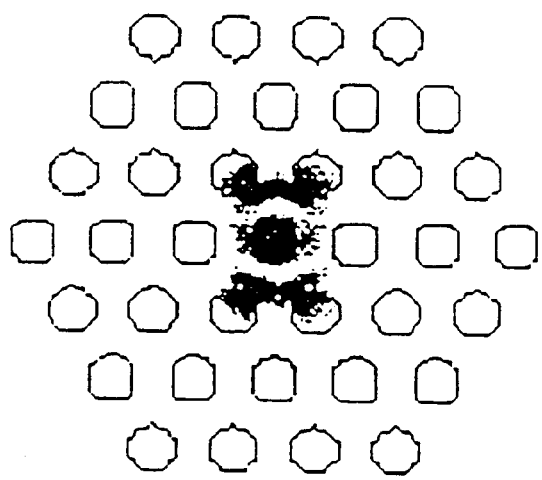

To localize photons in-plane a defect is formed in the periodic array of air holes 30. By removing a single hole 30 in the photonic lattice we create a local potential energy well for photons, resulting in a pair of degenerate dipole-like modes, very similar in nature to the defect modes of the infinite two dimensional photonic crystal. The localized modes of this cavity 36 can be described as a linear combination of the x and y dipole modes shown in FIGS. 10a and 10b. The defect modes of this structure have been previously analyzed in detail in the literature. The mode volume of the dipole modes is estimated to be 2.5 $(\lambda/2n)^3$, which is roughly 0.03 cubic microns at a wavelength of 1.55 microns.

The quality factor (Q) of the dipole modes is related to the stored energy (U) and radiated power ($P_{rad}$) as follows, $$Q = \omega \frac{U(t)}{P_{rad}(t)}$$

where ω is the angular frequency of the mode. The power radiated from the defect can be divided into a component due to photons which leak vertically from the waveguide, and a component due to photons which tunnel through the finite number of periods of the photonic crystal. The energy which escapes by tunneling can be reduced by simply adding more periods to the photonic crystal (limited eventually by scattering or absorption). The power which leaks out of the waveguide vertically can not be captured by adding more periods of the photonic crystal, and thus poses a much more serious limitation on the cavity Q. In order to reduce the vertical loss, smaller air holes are preferred which both increases the effective index guiding of the slab (less material removed) and reduces the photonic bandgap. The smaller bandgap results in a slightly shallower energy well, resulting in a mode which is broader in real space but narrower in k-space. The narrowing in k-space of the defect mode to regions around the band edge (X-point) reduces the coupling to leaky portions of the air band in FIGS. 8a and 8b. The calculated Q value for the cavities analyzed in the next section varies between 500–6000 (r/a=0.31 and d/a= 0.41) an improvement by a factor of two relative to the earlier low temperature lasers. The Q value can be increased further by increasing the waveguide thickness or by increasing the lateral dimension of the cavity 36, however this is at the expense of increasing the mode volume and potentially increasing the number of localized cavity modes.

Figure 11:
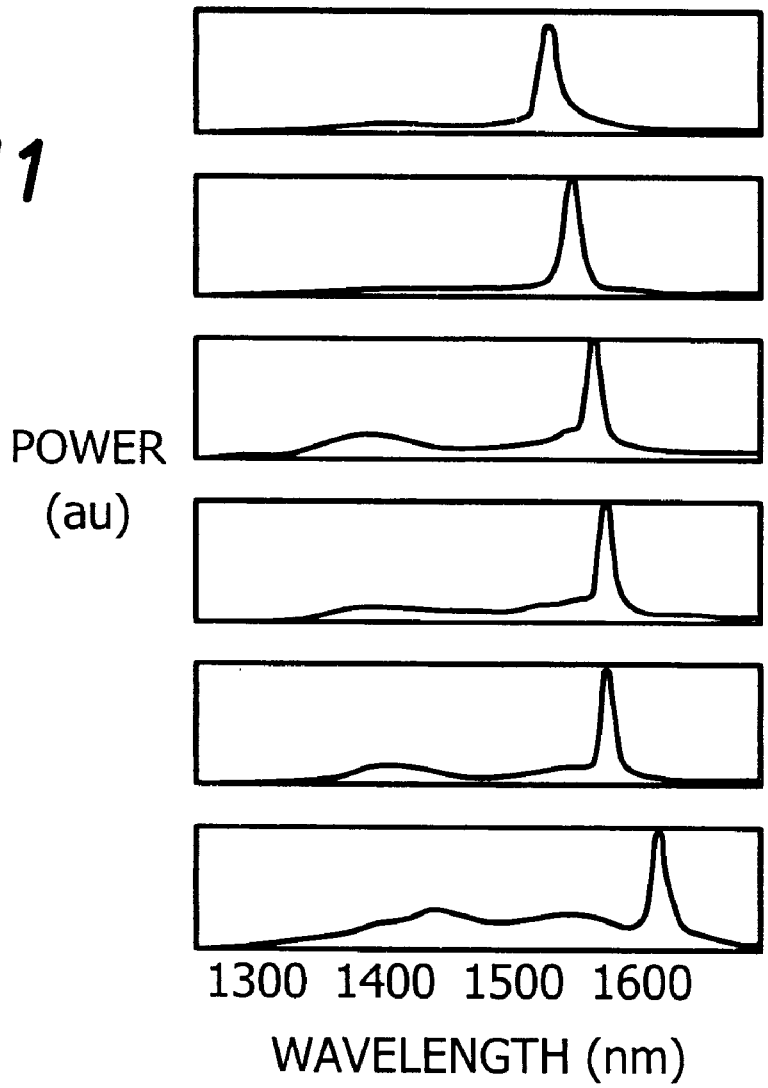
FIG. 11 is a series of graphs which illustrate the tuning of a two dimensional Fabry-Perot filtered emission peak in which the lattice parameter of the photonic crystal and the defect are systematically changed through microfabrication.

Spectra from single defect cavities have also been obtained by optical pumping. When the photonic bandgap lattice parameter is tuned to the emission wavelength of the InGaAsP active material, and a perfect photonic crystal membrane is defined by ion etching, very little luminescence is observed to emit from the patterned membrane. However, once a defect is introduced into such a photonic crystal membrane, a peak can be observed in the luminescence spectrum emitted from the PBG structure. This peak occurs at the wavelength expected for the cavity resonance, and can be tuned by changing the lattice parameter of the photonic crystal. As the lattice parameter is changed, the peak position is correspondingly shifted proportionally to the change. FIG. 11 summarizes the tuning of a two dimensional Fabry-Perot filtered emission peak. In this series of spectra, the lattice parameter of the photonic crystal and the defect are systematically changed through microfabrication. For all lattice parameters, a defect mode is supported within the gain peak of the quantum wells.

In the illustrated embodiment a 10×10 array of defect cavities was fabricated with varying lattice spacings and hole sizes in order to cover a wide range of wavelengths of the defect mode resonance. The lattice spacing was varied with row number in the array, covering a range from 580 nm to 480 nm. Within each row the hole diameter in a given device was varied by adjusting the exposure dose during the electron beam lithography. The ratio of r/a was thus varied from 0.30 to 0.33 as measured by SEM inspection after the devices were completely processed. The defect cavities consist of 8 periods of the photonic crystal surrounding a single removed hole in the center. The patterned membrane diameter varied with the lattice spacing, but was on average 8 microns. With 8 periods of photonic crystal the defect mode theoretically emits mostly in the vertical direction thus allowing measurements to be taken from the top of the sample.

The sample was mounted on an X-Y-Z stage and the defect cavities were optically pumped from above at an angle normal to the sample surface. A high numerical aperture, long working distance 100× objective lens was used to both image the defect cavities and to focus the optical pump beam. An 830 nm semiconductor laser diode was used as the pump source in this experiment. The photoluminescence (photoluminescence) was also collected by the objective lens and then fed into an optical spectrum analyzer. A GaAs filter was placed just before the optical spectrum analyzer to separate the pump from photoluminescence. The spot size of the beam on the sample surface could be adjusted down to 1 micron, however a spot size of approximately 4 microns was found to be optimum in the sense of providing the lowest threshold for lasing. We attribute this to the fact that the quantum wells in the photonic crystal mirror surrounding the defect will be absorbing if not pumped to transparency. Absorption in the two dimensional photonic crystal mirror will then limit the in-plane Q of the defect cavity 36. FDTD calculations indicate that to obtain a Q of roughly 200 requires at least 3 periods of the photonic lattice surrounding the defect, which corresponds to a 3 micron diameter. As the pump is de-focused to increase the spot size above 4 microns, the intensity in the center of the cavity 36 decreases to a point where the threshold pump power starts to rise. For consistency a pump beam spot size of roughly 4 microns was used throughout to take the data.

Figure 12A:
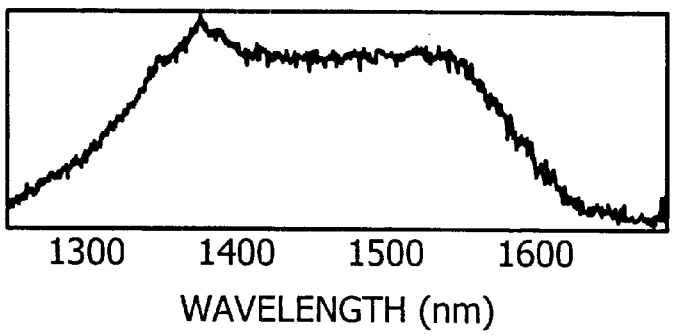
FIGS. 12a–12c are graphs of the photoluminescence spectra is shown for various duty cycles and pump powers.
Figure 12B:
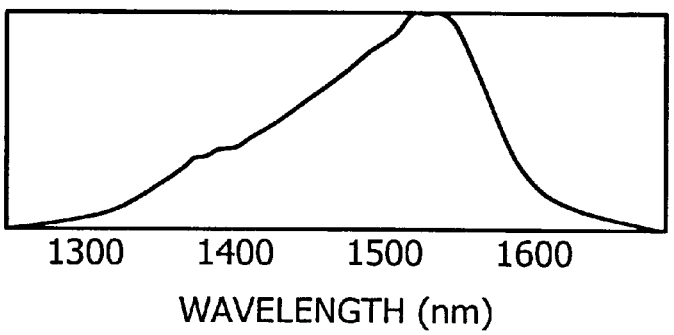
Figure 12C:
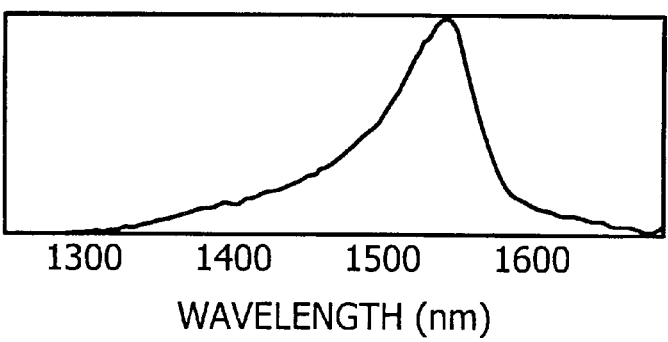

With the pump beam focused to a 4 micron spot we first measured the photoluminescence from an unprocessed area on the sample very near to the array of defect cavities. In FIGS. 12a–12c the photoluminescence spectra is shown for various duty cycles and pump powers. At low pump powers in FIG. 12c the emission is peaked at 1545 nm which corresponds to the first energy level in the quantum wells. As the pump power is increased in FIG. 12b a peak in the emission spectrum appears at 1380 nm corresponding to the second level in the quantum wells. FIG. 12a was obtained using similar pumping conditions as tie used to obtain lasing in the defect cavities (10 ns pulses, 0.3% duty cycle). The photoluminescence is very broad in this case, providing almost a 400 nm wide emission range over which the photonic crystal cavities can be characterized.

Figure 13:
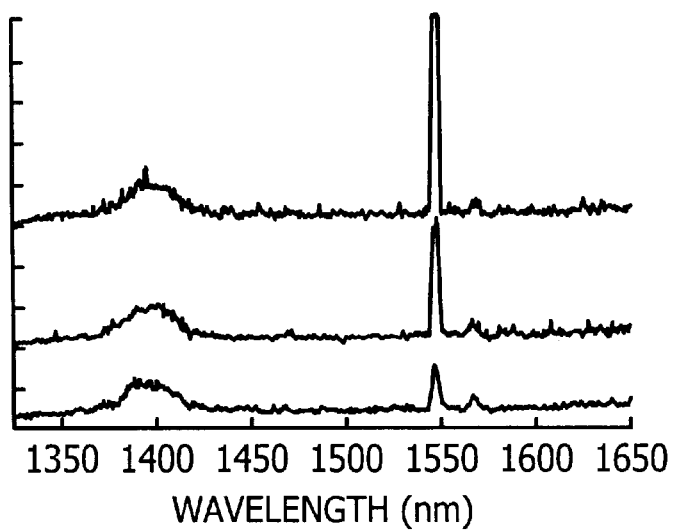
FIG. 13 is a graph of the emission spectrum for various pump powers from a defect cavity with a lattice spacing of 525 nm.

The photoluminescence from the defect cavities is markedly different than from the unprocessed areas. The emission spectrum for various pump powers from a defect cavity 36 with a lattice spacing of 525 nm is shown in FIG. 13. The emission can be seen to be strongly frustrated except for two peaks. The shorter wavelength peak near 1400 nm most likely corresponds to emission from the leaky air band modes. The narrower peak at 1547 nm corresponds to emission into the defect modes. A smaller peak is just visible to the right of the defect mode peak at 1567 nm. It is not clear what the source of this peak is. It shows up red shifted from the defect mode peak by 20–25 nm in almost all the laser cavity spectra. One explanation for this extra peak might be the splitting of the degeneracy (due to fabrication "defects") of the dipole modes, resulting in two separate resonances. In cavities where a splitting has been intentionally fabricated we indeed get two lasing modes, however they are both accompanied by a red shifted peak. A more plausible explanation is that the side peak is due to a phonon replica of the laser line from Raman scattering of the laser mode with the vibrational modes of the perforated membrane.

Figure 14:
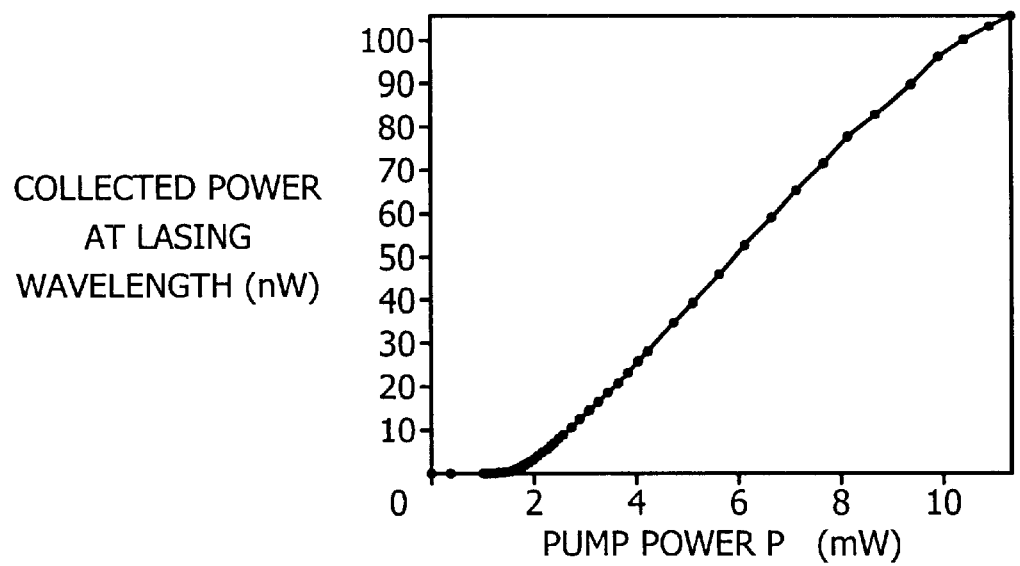
FIG. 14 is a plot of the collected power versus the pump power (L—L) for a typical defect cavity 36.

A plot of the collected power versus the pump power (L—L) for a typical defect cavity 36 is shown in FIG. 14.

The external threshold pump power (peak) is approximately 1.5 mW, from which we estimate an absorbed power of 500 $\mu$W (~3.1 kW/cm$^2$). The polarization of the laser peak (measured in the plane of the slab) becomes linearly polarized above threshold. The fiber coupled average power from some of the defect laser cavities is as high as 4 nW, which corresponds to an approximate peak power of 1 $\mu$W. This is roughly 30 dB above the shorter wavelength resonance peak of the air band. We were able to obtain lasing at duty cycles up to 1% (30 ns pulses) however threshold pump powers were significantly increased due to heating in the membrane. The relatively large threshold powers are most likely a result of the poor heat sinking of the membrane cavity 36. Non-radiative Auger recombination exponentially increases with temperature and is especially problematic in small bandgap materials such as InGaAsP.

The line width of the defect mode narrows from 1.1 nm just below threshold to 0.15 nm at 4 times threshold. An estimate of the Q of the defect modes can be made by measuring the line width of the resonance at transparency. From an approximate absorbed threshold pump power of 500 $\mu$W we estimate the threshold carrier density is 3 times the transparency carrier density. At a duty cycle of 0.3% the average detected power was too small to make accurate line width measurements near the transparency pumping level. Due to the to temperature sensitivity of the membrane cavities we were also not able to increase the duty cycle mulch beyond 1% without significantly reducing the photoluminescence due to non-radiative effects. For several of the higher threshold devices line widths of ~2.5 nm were measured at pump levels which were 2.5 times below threshold. This gives an upper bound Q value of 600 for the higher threshold defect modes which is consistent with the FDTD calculated values.

Figure 15:
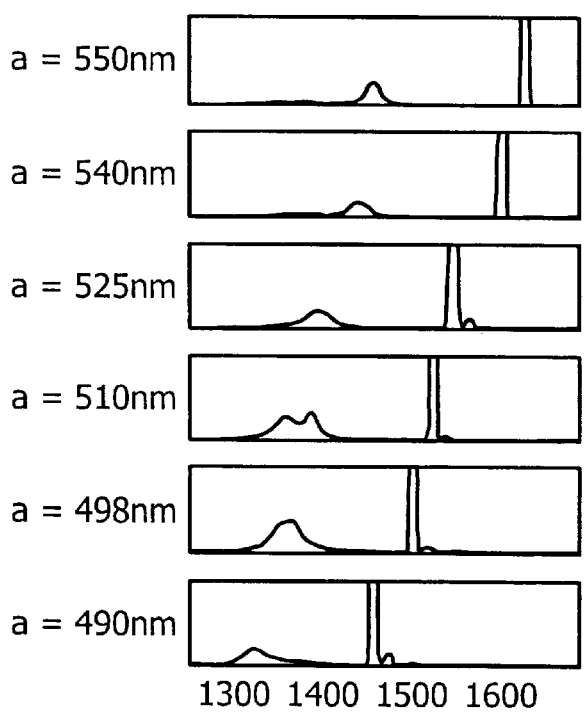
FIG. 15 is a series of spectra obtained from defect cavities with lattice spacings ranging from 550 nm down to 490 nm.
Figure 16:
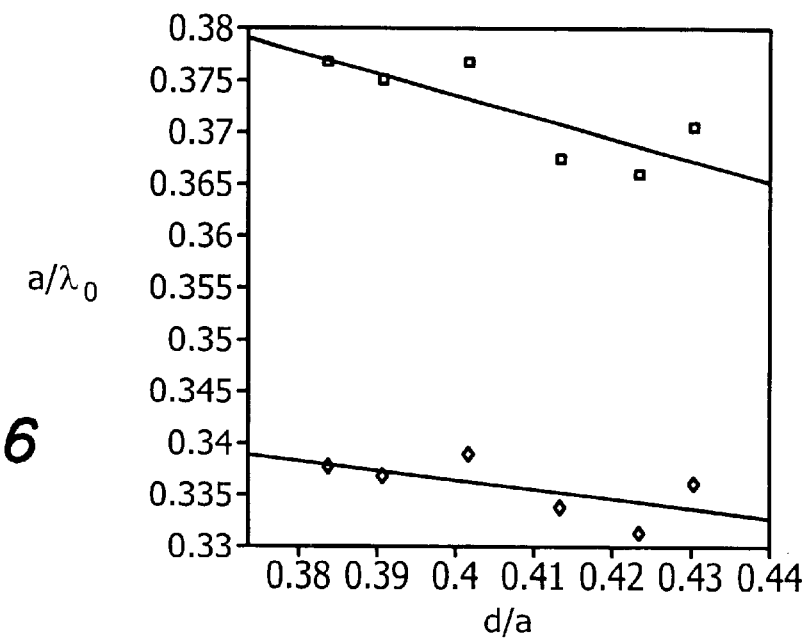

The defect mode lasing wavelength can be tuned throughout the gain bandwidth by lithographically adjusting the defect cavity geometry. This allows one to define a multi-wavelength array of laser sources on a single monolithic wafer. Coarse tuning can be obtained by scaling the lattice spacing. A series of spectra obtained from defect cavities with lattice spacings ranging from 550 nm down to 490 nm is shown in FIG. 15. The defect cavities were chosen from the same column in the array so as to keep the r/a ratio the same for each device as the lattice spacing varied. The defect lasing peak was successfully tuned from 1460 nm to 1620 nm with a wavelength spacing of roughly 30 nm. The devices with lattice spacings above 550 nm and below 490 nm did not lase due to the fact that they were tuned out of the gain bandwidth. The broad short wavelength peak attributed to the leaky air band modes is also seen to tune with lattice spacing as expected. A plot of the ratio of a/$\lambda_0$ of the emission peaks versus d/a is shown in FIG. 16. This compares quite well with the theoretical plot given in FIGS. 8$a$ and 8$b$. The defect mode normalized frequency as well as the air band frequency increase with shrinking d/a as predicted by theory. The defect mode normalized frequency is roughly 0.335 which is slightly above the midgap value in FIGS. 8$a$ and 8$b$.

Figure 17:
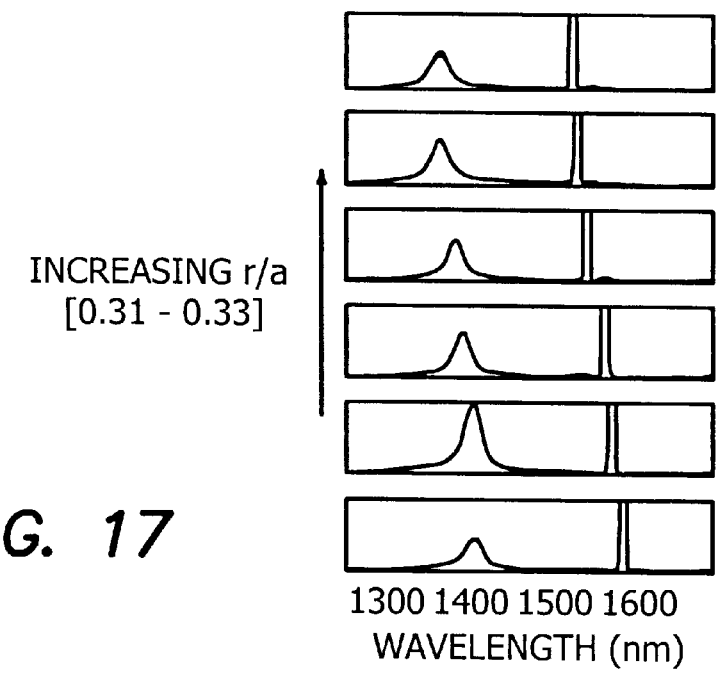
FIG. 17 is a plot of the spectra of several defect lasers with lattice spacing fixed at 490 nm and varying hole radius.

Another approach to tuning the defect mode resonance is to adjust the radius of the air holes in the two dimensional photonic crystal lattice while keeping the lattice spacing constant. A plot of the spectra of several defect lasers with lattice spacing fixed at 490 nm and varying hole radius is shown in FIG. 17. The lasing wavelength tunes between 1520 am and 1580 nm with an inter-wavelength spacing of 10 nm as the r/a ratio is varied from 0.33 to 0.31. This corresponds to a change in the diameter of the air holes of only 4–5 nm from device to device which is close to the limit of our lithography.

In conclusion, we have demonstrated pulsed room temperature lasing at 1.5 microns in an optically pumped two dimensional photonic crystal cavity 36 with a single missing hole (defect). The modal volume of the defect modes is theoretically as small as 2.5($\lambda$/2n)$^3$. By reducing the hole size of the two dimensional photonic crystal mirror we have been able to reduce the waveguide losses of the defect cavity 36 and increase the Q by a factor of two or more. The estimated absorbed threshold pump power of the defect cavities is 500 $\mu$W, limited mainly by non-radiative Auger recombination due to heating of the membrane cavity 36. We have also formed a two-dimensional array of such defect cavities and lithographically tuned the wavelength over a 150 nm range on a single monolithic wafer. FDTD simulations of the defect cavity 36 agree very well with the measured photoluminescence data and are used to design such parameters as lasing wavelength, emission pattern, and cavity Q.

An optical switch can also be fabricated based on controlling the direction of light emission. Again, we know that within a perfectly symmetric optical cavity 36, very small changes in the lasing Qs in the different directions can change the lasing direction. By changing the relative losses which the laser would encounter in the different lasing directions, we can modulate the emission direction at very high speeds. By reducing the absorption losses, for example. through electrical or optical pumping of the light emission paths, it is possible to turn on and off a lasing direction and couple the resulting light into an output waveguide. This should result in a very fast and very efficient switch, since the change in Qs in different directions which determine the direction of lasing may be very small.

Figure 18:
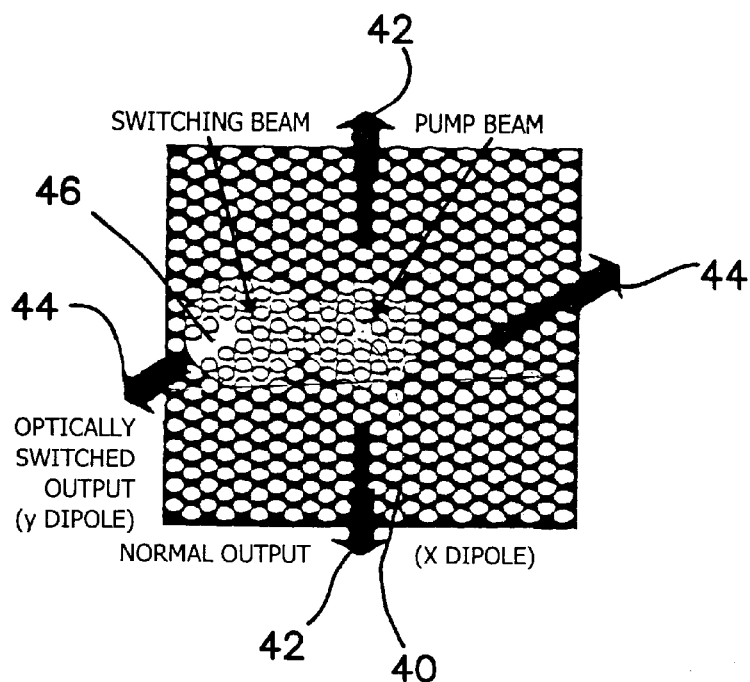
FIG. 18 is the top plan view diagram of a geometry of a bistable laser devised according to the invention.

In switchable laser sources, the direction of light emission from an optical microcavity is controlled. With a perfectly symmetric optical cavity, small changes in the modal Qs in the different directions can determine the lasing direction. By changing the relative losses, and thereby the Qs which the losing mode encounters, we can modulate the emission direction at very high speeds. The Q can within a mode be changed by reducing the absorption losses, through electrical or optical pumping of the light emission paths, it is possible to turn on and off a given lasing direction and to couple the resulting light into output waveguides. FIG. 18 illustrates the proposed geometry of such a bistable laser. A single defect 40 within a two dimensional photonic crystal forms the optical cavity. The Qs of the two perpendicular dipoles are designed and fabricated to favor lasing in the Y dipole mode (shown by bar arrows 42 in the vertical direction). As another light beam directed to cavity 46 is used to reduce the absorption losses of the x dipole, the Q of that mode is improved, and lasing is then favored in the that mode, which switches emission to the horizontal direction 44. Since no change in the carrier density is needed to switch the lasing mode, this change in lasing direction is expected to be limited only by the photon lifetime, which is on the order of 1 picosecond for optical nanocavities. Furthermore, the modulation should be extremely efficient, since the change in Qs needed to alter the lasing direction can be very small. To take advantage of this modulation in lasing photonic bandgap waveguides can be constructed within the two dimensional PBG crystal to couple out the light from this fast modulating source. Such waveguides have actually been fabricated in both Group III and V semiconductor slabs well as silicon.

Figure 19:
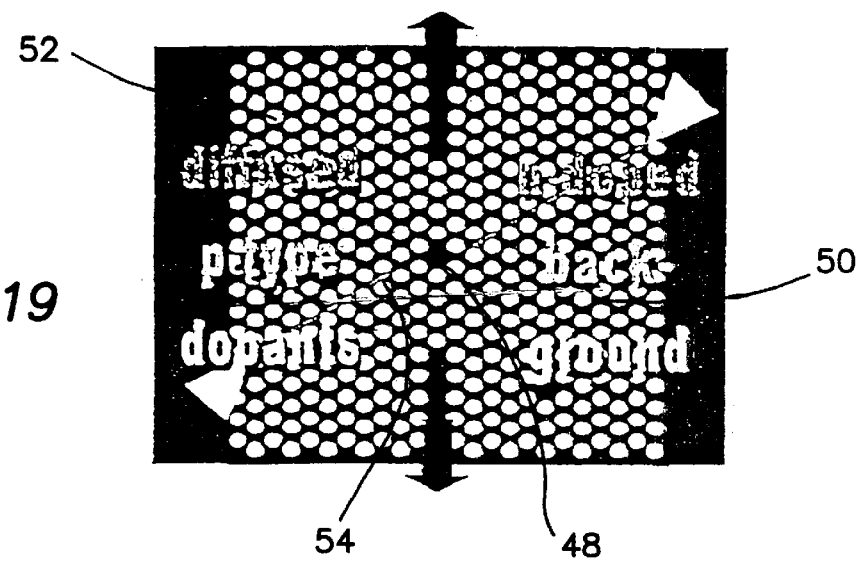
FIG. 19 is a top plan diagrammatic view of a lateral p-n junction formed by diffusing p-dopants into a n-doped semiconductor slab, and thereby forming a p-n junction in the optical cavity.

To take advantage of the efficiency of two dimensional photonic crystal lasers and reduce heating, it is desirable to electrically pump these cavities. However, the absorption resulting from electrical contacts, as well as free carrier absorption within the doped layers, can significantly reduce the Qs of the optical microcavities. Therefore, it is desirable to optimize the electrical contacts and the dopant concentrations. In the simplest geometry, a lateral p-n junction 54 can be formed by diffusing p-dopants 52 into a n-doped semiconductor slab 50, and thereby forming a p-n junction in the optical cavity 48 as shown in FIG. 19.

Figure 20A:
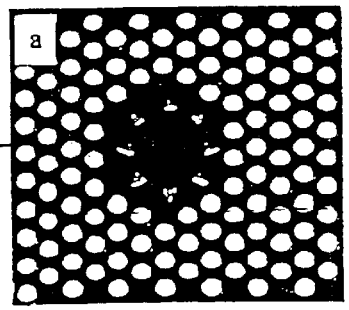
FIG. 20a is a top plan diagrammatic view and FIG. 20b is a side cross-sectional perspective view of a cavity without any electrical contact.
Figure 20C:
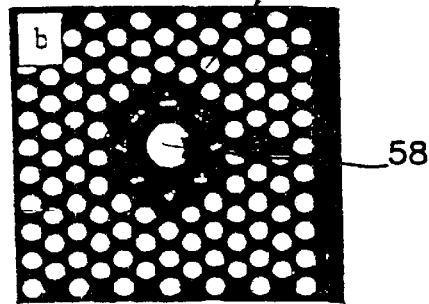
FIG. 20c is a top plan view and FIG. 20d is a side cross-sectional perspective view diagram respectively of a cavity with an electrical contact and an air bridge or wire connected to the electrical contact.
Figure 20B:
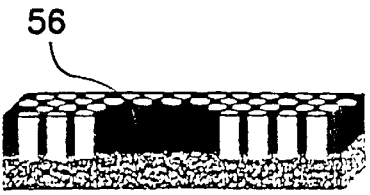
Figure 20D:
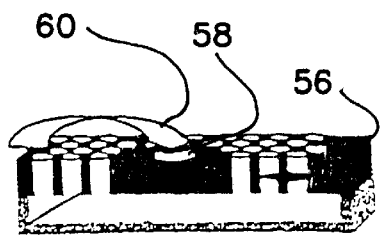

Larger photonic crystal cavities can be electrically pumped by carefully depositing the metal contact on the optical cavity to minimize absorption losses in the high-Q losing mode. FIGS. 20a–20d shows this geometry in a hexagonal photonic crystal laser, in which whispering gallery modes" close to the edge of the optical cavity 56 are generally the highest Q modes and the first to lase. FIGS. 20a and 20b are top plan view and side cross-sectional perspective view diagrams of a cavity 56 without any electrical contact respectively. FIGS. 20c and 20d are top plan view and side cross-sectional perspective view diagrams of a cavity 56 with an electrical contact 58 and an air bridge or wire 60 connected to electrical contact 58 respectively.

Consequently, placement of the electrical contact 58 in the center of the cavity 56 results in little or no interaction of light with the metal contact 58, but still allows carrier diffusion and recombination at the circumference of the laser cavity and efficient pumping of the mode of interest. To connect to the metal contact 58, an air bridge 60 is constructed across the photonic crystal mirror.

Figure 21A:
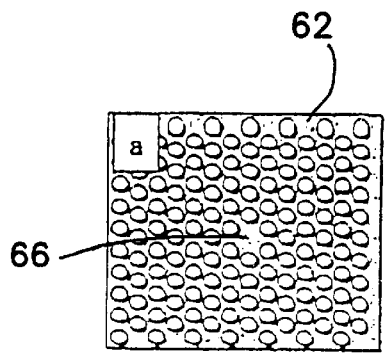
FIG. 21a is a top plan view and FIG. 21b is a side cross-section perspective view of epitaxially grown p- and n-doped contact layers separated by a self-aligned electrical pumping aperture.
Figure 21B:
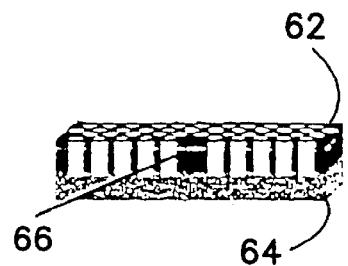
Figure 21C:
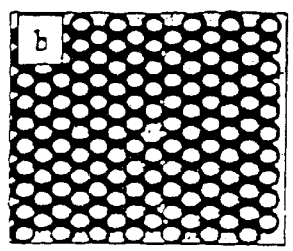
FIG. 21c is a top plan view and FIG. 21d is a side cross-sectional perspective view of the laser of FIGS. 21a and 21b after a selective AlAs oxidation step.
Figure 21D:

A more sophisticated approach towards electrically pumping can result from using epitaxially grown p- and n-doped contact layers 62 and 64 respectively as shown in FIGS. 21a and 21b, separated by a self-aligned electrical pumping aperture 66. For example, selective oxidation of aluminum arsenide through the etched holes which define the photonic crystal can be used to electrically isolate the doped regions within the photonic crystal as illustrated in FIGS. 21c and 21d. The oxidation time can be optimized so that current will only flow where there is a defect or an area larger than the average lattice spacing. This approach will be most effectively used when designing photonic crystal quantum dot lasers, in which InAs islands (quantum dots) serve as the light-emitting material (with 1.1–1.3 μm emission wavelength) on a GaAs subsume.

Figure 21E:
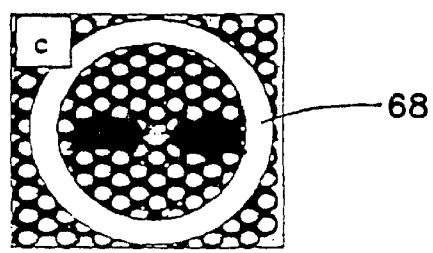
FIG. 21e is a top plan view and FIG. 21f is a side cross-sectional perspective view of the laser of FIGS. 21c and 21d after deposition of a contact.
Figure 21F:

FIGS. 21a–21f show the fabrication sequence for defining such electrically pumped lasers with self-aligned current apertures 66. FIGS. 21a and 21b illustrate the resulting structure after lithography and etching as described above. In the illustrated approach in FIGS. 21c and 21d, we rely on the difference in time required for oxidizing between the holes 30 defining the photonic crystal and the time it takes to oxidize underneath the defect cavities 66. Since the oxidation rate is very sensitive to the aluminum arsenide thickness and precise composition, the same oxidation step can also be designed to convert a layer of AlAs below the photonic crystal to oxide. The AlAs oxidation technique is particularly suited for photonic crystal lasers with InGaP quantum wells and InGaAs quantum dots. In both of these materials systems, the surface recombination is significantly reduced over the GaAs quantum wells, which we believe will not be suitable for single defect PBG lasers without surface passivation. FIGS. 21e and 21f show the deposition of a ring contact to electrically pump aperture layer 66.

It should be noted that although a very porous structure was generated by perforating the multiple quantum well active area, the vertical emission efficiency from correctly tuned two dimensional photonic crystals can be significantly higher than that of the unpatterned material. This improvement in the extraction efficiency is a direct result of the more efficient coupling of light out of the plane of the waveguiding membrane. As a result of this microfabricating a photonic band gap tuned to the luminescence wavelength, light is no longer allowed to propagate within the microfabricated membrane. The high luminescence intensity achieved by this geometrically optimum coupling structure is useful in designing highly efficient light emitters. An even more interesting effect expected from very small single defect microcavities is a change in the spontaneous emission rate. This effect requires the combination of a small optical cavity volume, restricting the number of modes supported by the cavity 36, and a reasonably high cavity Q. The measurement results described here confirm that in the InGaAs/InGaAsP material system the surface damage and sidewall recombination of carriers is low enough to observe such spontaneous emission rate effects. Thus, efficient light generation is possible and the emission characteristics within very small volume optical microcavities can be explored even without surface passivation of the etched sidewalls. Further improvements in the luminescence efficiency are expected from such sidewall passivation and by more effective heat sinking of the membranes.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A waveguide for conducting light comprising:
   a substrate;
   a high refractive index waveguiding membrane disposed over the substrate forming an air cavity therebetween, the waveguiding membrane confining the light propagating therein by way of total internal reflection, the waveguiding membrane thickness as measured by the wavelength of light propagating in the waveguiding membrane is less than one wavelength thick;
   a photonic bandgap (PBG) crystal being defined in said waveguiding membrane by a periodic array of holes defined through the waveguiding membrane; and
   an optical cavity being defined in the photonic bandgap (PBG) crystal by means of a defect in the periodicity of the array of holes in said waveguiding membrane, the optical cavity confining light therein, and having a mode volume on the order of one cubic wavelength or less.

2. The waveguide for light of claim 1 where the waveguiding membrane defines a planar surface and where the periodic array of holes Bragg reflects the light in the plane within said waveguiding membrane.

3. The waveguide for light of claim 2 where said array of holes forms a two dimensional photonic lattice of holes in said waveguiding membrane.

4. The waveguide for light of claim 3 where the defect is formed in said two-dimensional photonic lattice by removing at least one hole from said array.

5. The waveguide for light of claim 3 where each hole has a diameter and where the defect is formed in said two-dimensional photonic lattice by adjusting said diameter of selected holes neighboring said defect.

6. The waveguide for light of claim 3 wherein the defect is characterized by a geometry which defines at least one mode of lasing within said cavity which is highly localized to a region neighboring said defect.

7. The waveguide for light of claim 6 wherein said geometry allows photons to escape from said region neighboring said defect by tunneling through said two dimensional photonic crystal.

8. The waveguide for light of claim 6 wherein said geometry allows photons to escape from said region neighboring said defect by leaking from said waveguiding membrane.

9. The waveguide for light of claim 3 wherein said array is a triangular array of holes in said waveguiding membrane which has a high dielectric constant, and which array exhibits a band gap for both transverse electric (TE) and transverse magnetic (TM) polarizations.

10. The waveguide for light of claim 3 wherein said array is a hexagonal array of holes in said waveguiding membrane which has a high dielectric constant, and which array exhibits a band gap for both transverse electric (TE) and transverse magnetic (TM) polarizations.

11. The waveguide for light of claim 3 wherein the defect comprises a single defect is formed in said two-dimensional photonic lattice.

12. The waveguide for light of claim 3 wherein a defect is formed in said two-dimensional photonic lattice characterized by an X and Y dimension, and wherein said defect is oriented with respect thereto to preferentially allow an X dipole mode in said cavity.

13. The waveguide for light of claim 3 wherein the defect formed in said two-dimensional photonic lattice has an X and Y dimension, and wherein said defect is oriented with respect thereto to preferentially allow an Y dipole mode in said cavity.

14. The waveguide for light of claim 1 where said cavity has a mode volume as small as 2.5 cubic half wavelengths.

15. The waveguide for light of claim 1 where said cavity has a mode volume smaller than or equal to $0.3\ \mu m^3$.

16. The waveguide for light of claim 1 where said mode volume sized so that spontaneous emission is coupled into a lasting mode.

17. The waveguide for light of claim 8 where said mode volume sized so that over 85% of the spontaneously emitted light is coupled into a single lasing mode.

18. The waveguide for light of claim 1 further comprising at least one additional photonic device optically coupled to said waveguide through said membrane.

19. The waveguide for light of claim 1 wherein said waveguiding membrane is fabricated in a InGaAs/InGaAsP material system.

20. The waveguide for light of claim 1 wherein said waveguiding membrane is half wavelength thick in order to shrink the optical mode volume of said cavity.

21. The waveguide for light of claim 1 wherein said cavity is a triangular region of unperforated material in said guiding waveguide.

22. The waveguide for light of claim 1 wherein said cavity is an hexagonal region of unperforated material in said guiding waveguide.

23. The waveguide for light of claim 1 further comprising two of said cavities disposed adjacent to each other in which one cavity is adapted to be pumped and the other cavity is adapted to be modulated, so that the lasing mode of said pumped cavity is modulated.

24. The waveguide for light of claim 23 where said modulated cavity is switched causing said pumped cavity to switch lasing modes.

25. The waveguide for light of claim 1 further comprising doped layers defining a p-n junction defined laterally through said cavity to reduce free carrier absorption within said doped layers.

26. The waveguide for light of claim 1 wherein said cavity has a geometry characterized by a center and further comprising an electrical contact disposed on a surface of said waveguiding membrane in the center of said cavity.

27. The waveguide for light of claim 1 further comprising:
   epitaxially grown p- and n-doped contact layers;
   a self-aligned electrical pumping aperture between said epitaxially grown p- and n-doped contact layers, wherein selective oxidation through said holes which define said photonic crystal electrically isolate said p- and n-doped regions within said photonic crystal; and
   a ring contact to electrically pump said aperture layer.

28. A method of fabricating a waveguide for propagating light comprising:
   providing a high refractive index waveguiding membrane to confine the light propagating therein by way of total internal reflection, the waveguiding membrane disposed over a substrate forming an air cavity therebetween;
   providing said waveguiding membrane with a thickness as measured by the wavelength of light propagated in the waveguiding membrane of less than the wavelength;

providing a photonic bandgap (PBG) crystal in said waveguiding membrane by defining a periodic array of holes through the waveguiding membrane; and defining a defect in the periodicity of the array of holes to define an optical cavity in the photonic bandgap (PBG) crystal, the optical cavity confining light therein and having a mode volume on the order of one cubic wavelength or less.

29. The method of claim 28 where defining a periodic array of holes through the waveguiding membrane forms a two dimensional photonic lattice in said waveguiding membrane.

30. The method of claim 29 where defining a defect in the periodicity of the array of holes comprises removing at least one hole from said array.

31. The method of claim 29 where each hole has a diameter and where defining a defect in the periodicity of the array of holes comprises adjusting said diameter of selected holes neighboring said defect.

32. The method of claim 29 where defining a defect in the periodicity of the array of holes comprises defining a defect which is characterized by a geometry with at least one mode of lasing within said cavity which is highly localized to a region neighboring said defect.

33. The method of claim 32 where defining a defect in the periodicity of the array of holes comprises defining a defect which is characterized by a geometry which allows photons to escape from said region neighboring said defect by tunneling through said two dimensional photonic crystal.

34. The method of claim 32 where defining a defect in the periodicity of the array of holes comprises defining a defect which is characterized by a geometry which allows photons to escape from said region neighboring said defect by leaking from said waveguiding membrane.

35. The method of claim 29 where defining a defect in the periodicity of the array of holes comprises defining an array which is a triangular array of holes in said waveguiding membrane which has a high dielectric constant, and which array exhibits a band gap for both transverse electric (TE) and transverse magnetic (TM) polarizations.

36. The method of claim 29 where defining a defect in the periodicity of the array of holes comprises defining an array which is a hexagonal array of holes in said waveguiding membrane which has a high dielectric constant, and which array exhibits a band gap for both transverse electric (TE) and transverse magnetic (TM) polarizations.

37. The method of claim 29 wherein defining a defect in the periodicity of the array of holes comprises defining an array having a single defect formed in said two-dimensional photonic lattice.

38. The method of claim 29 where defining a defect in the periodicity of the array of holes comprises defining an array having a defect formed in said two-dimensional photonic lattice characterized by an X and Y dimension, and wherein said defect is oriented with respect thereto to preferentially allow an X dipole mode in said cavity.

39. The method of claim 29 where defining a defect in the periodicity of the array of holes comprises defining an array having a defect formed in said two-dimensional photonic lattice characterized by an X and Y dimension, and wherein said defect is oriented with respect thereto to preferentially allow an Y dipole mode in said cavity.

40. The method of claim 28 where defining a subwavelength optical cavity defines a cavity having a mode volume as small as 2.5 cubic half wavelengths.

41. The method of claim 28 where defining an optical cavity defines a cavity having a mode volume smaller than or equal to 0.3 $\mu$m$^3$.

42. The method of claim 28 where defining a subwavelength optical cavity defines a cavity having a mode volume sized so that spontaneous emission is coupled into a lasing mode.

43. The method of claim 42 where defining a subwavelength optical cavity so that spontaneous emission is coupled into a lasing mode defines said cavity with a mode volume sized so that over 85% of the spontaneously emitted light is coupled into a single lasing mode.

44. The method of claim 28 further comprising providing at least one additional photonic device optically coupled to said method through said membrane.

45. The method of claim 28 where providing a high refractive index waveguiding membrane provides a waveguiding membrane fabricated in a InGaAs/InGaAsP material system.

46. The method of claim 28 where providing a high refractive index waveguiding membrane provides a waveguiding membrane which is half wavelength thick in order to shrink the optical mode volume of said cavity.

47. The method of claim 28 wherein defining a defect to define an optical cavity having a mode volume of the order of one cubic wavelength or less comprises defining a triangular region of unperforated material in said guiding waveguide.

48. The method of claim 28 wherein defining a defect to define an optical cavity having a mode volume of the order of one cubic wavelength or less comprises defining an hexagonal region of unperforated material in said guiding waveguide.

49. The method of claim 28 further comprising defining two of said cavities disposed adjacent to each other in which one cavity is adapted to be pumped and the other cavity is adapted to be modulated, so that the lasing mode of said pumped cavity is modulated.

50. The method of claim 28 further comprising defining a p-n junction laterally through said cavity to reduce free carrier absorption within said doped layers.

51. The method of claim 28 wherein said cavity has a geometry characterized by a center and further comprising disposing an electrical contact on a surface of said waveguiding membrane in the center of said cavity.

52. The method of claim 28 further comprising:

epitaxially growing p- and n-doped contact layers;

defining a self-aligned electrical pumping aperture between said epitaxially grown p- and n-doped contact layers;

selectively oxidizing through said holes which define said photonic crystal to electrically isolate said p and n doped regions within said photonic crystal; and disposing a ring contact on said contact layers to electrically pump said layer.

* * * * *